United States Patent [19]
Jaquette

[11] Patent Number: 5,357,150
[45] Date of Patent: Oct. 18, 1994

[54] DEFECT TOLERANT ENVELOPE FOLLOWER

[75] Inventor: Glen A. Jaquette, Tucson, Ariz.

[73] Assignee: International Business Machines Corporation, Armonk, N.Y.

[21] Appl. No.: 972,395

[22] Filed: Nov. 6, 1992

[51] Int. Cl.⁵ .......................................... H03K 17/30
[52] U.S. Cl. .................................. 307/358; 307/520; 307/530; 307/494
[58] Field of Search ................ 307/530, 520, 494, 358

[56] References Cited

U.S. PATENT DOCUMENTS

| | | | |
|---|---|---|---|
| 3,911,776 | 10/1975 | Beigel | 84/1.11 |
| 4,321,488 | 3/1982 | Srivastava | 307/358 |
| 4,346,411 | 8/1982 | Buhler et al. | 360/46 |
| 4,356,410 | 10/1982 | Miskin | 307/494 |
| 4,648,118 | 3/1987 | Hitosumachi | 381/94 |
| 4,866,301 | 9/1989 | Smith | 307/246 |
| 4,914,398 | 4/1990 | Jove et al. | 328/167 |
| 5,057,785 | 10/1991 | Chung et al. | 307/521 |
| 5,101,395 | 3/1992 | Cardero et al. | 369/59 |

OTHER PUBLICATIONS

Rackl, W. K., Dynamic Threshold Circuit, "IBM Technical Disclosure Bulletin," vol. 15, No. 4, Sep. 1972.

*Primary Examiner*—Richard A. Bertsch
*Assistant Examiner*—M. Kocharov
*Attorney, Agent, or Firm*—D. A. Shifrin

[57] ABSTRACT

An envelope follower is provided which reduces defect propagation when reading analog information signals from a read head of, for example, an optical drive or a magneto-resistive tape drive. In a preferred embodiment, the envelope follower includes a differential amplifier, to sense the difference between the amplitude of the information signal and an envelope voltage across a capacitor, and a current mirror, responsive to the differential amplifier, to charge the capacitor at a predetermined rate when the amplitude of the information signal exceeds the envelope voltage. When the amplitude of the information signal is below the envelope voltage, the current mirror is deactivated by the differential amplifier and the capacitor is allowed to discharge through a voltage divider. The output of the voltage divider is a threshold voltage which is compared with the information signal by another comparator to generate a digital signal representative of the analog information signal, typically used as a qualifier in a qualified peak detector.

19 Claims, 2 Drawing Sheets

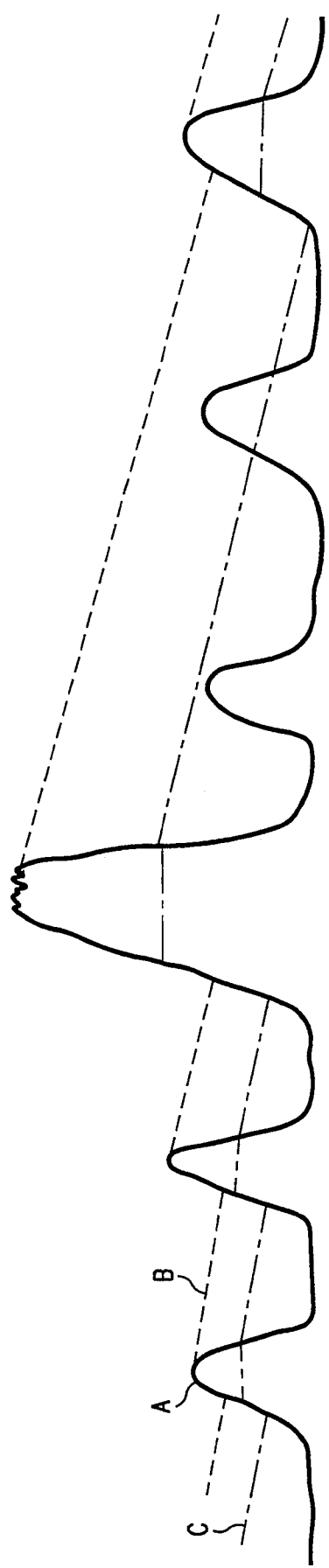
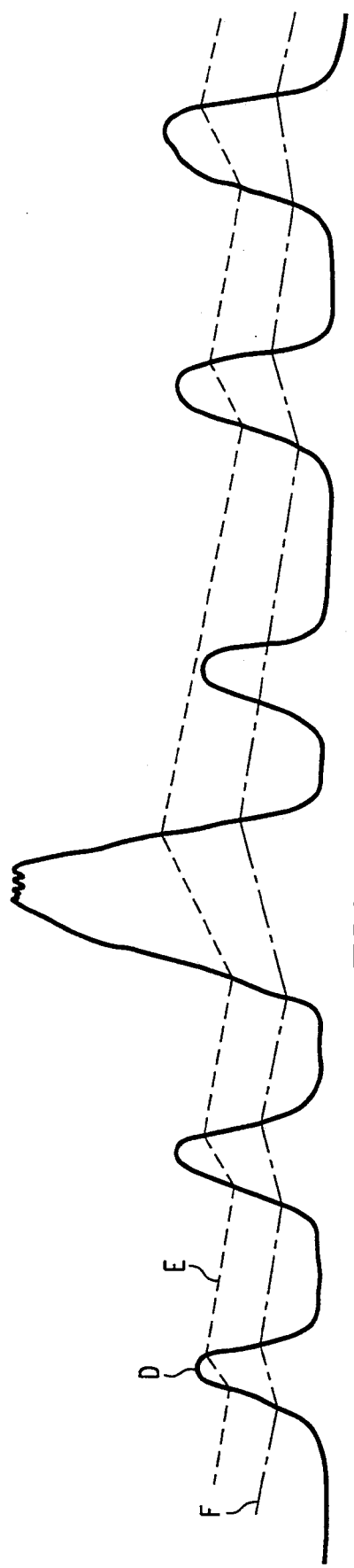
FIG. 1 (PRIOR ART)
FIG. 4

DEFECT TOLERANT ENVELOPE FOLLOWER

TECHNICAL FIELD OF THE INVENTION

The present invention relates to envelope followers and, in particular, to a defect tolerant envelope follower well suited for use in reading data from storage media, such as magnetic tape and optical disks.

BACKGROUND OF THE INVENTION

Heads for reading data from storage media convert modulation of a reflected optical beam from an optical disk or magnetic flux variations from a magnetic disk or tape into analog electrical signals. The analog information signals are subsequently processed through an apparatus, such as a qualified peak detector with an envelope follower used to derive a threshold for peak qualification, and converted into digital signals representative of the data read from the medium. In a conventional envelope follower, the information signal is applied to a capacitor through a diode. When a pulse, representing information from the storage medium, occurs having an amplitude greater than the voltage across the capacitor plus the forward bias of the diode, the diode is turned on, charging the capacitor.

After the pulse passes, the capacitor discharges at a predetermined rate (dependant upon the time constant of the capacitor but slow relative to the frequency of the information signal) until the next pulse charges the capacitor. Thus, the voltage across the capacitor forms the upper boundary of an "envelope" approximating the maximum amplitude of the analog information pulses (minus one diode drop); the lower boundary of the analog information signals can be a predetermined DC base level, such as provided by a DC restore circuit, or could be followed by another envelope follower. To allow low amplitude signal to be detected and processed as an information pulse, the envelope voltage is reduced, such as by a voltage divider, to a threshold level. Both the information signal and the threshold voltage are input into a comparator which outputs a digital signal only if the amplitude of a pulse in the information signal exceeds the threshold voltage. This is commonly used as the "qualifier" of a qualified peak detector.

Although amplitudes of the information pulses making up the analog signals are generally within a particular range, the information signals from the read head can contain pulses of particularly high amplitude ("glitches" or defects) outside the normal range. For example, if a pit in an optical disk is elongated or otherwise not properly formed, or if a physical defect exists in the optical media surface, the resulting information signal can also be defective and contain a glitch. Information signals generated by magneto-resistive heads for reading magnetic tape can contain singularities caused by thermal spikes. Not only are such defects and spikes processed as information pluses, they can also charge the capacitor to such an extent that the threshold voltage, related to the envelope voltage, remains greater than the maximum amplitude of one or more subsequent valid information pulses. Consequently, in a condition known as defect propagation, those valid pulses will not be detected and information will be lost. Moreover, current through portions of the envelope follower can exceed the maximum specified current thereby reducing component life or even destroying components.

Prior attempts to reduce defect propagation have included clipping the information signal or limiting the envelope to prevent excess charging of the capacitor but have not been wholly satisfactory. For example, an approximately 2:1 headroom should be provided between the normal envelope and the voltage which clips the threshold to allow normal envelope following operation of a low AC coupling pole for information signal having a large DC content. However, defect propagation can adversely impact proper peak detection. Additionally, a common conventional design employing a "diode into a capacitor" type envelope follower described above is non-linear due to the diode characteristics.

SUMMARY OF THE INVENTION

The present invention provides a peak detector qualifier with an envelope follower having substantially linear response characteristics and having decreased sensitivity to the effects of physical defects in a storage medium and other defects in the information signal, thereby reducing defect propagation. The envelope follower comprises a capacitive device (such as a capacitor); a current source for generating a predetermined current; a comparator for comparing an amplitude of an information signal with an envelope voltage across the capacitor; and a switch, coupled to the current source and responsive to the comparator. The switch has a first state when the amplitude of the information signal is greater than the envelope voltage, whereby the capacitor is charged by the predetermined current, and a second state when the amplitude of the information signal is less than the envelope voltage, whereby the capacitor is allowed to discharge. Preferably, the comparator and the switch are a differential amplifier coupled to receive the envelope voltage and an information signal. Also preferably, the current source is a current mirror coupled between the differential amplifier and the capacitor to generate the predetermined current when the differential amplifier is in the first state.

The peak detector qualifier can also include a voltage divider or other means for establishing a threshold voltage. According to the present invention, the envelope voltage developed across the capacitor will not charge faster than a predetermined rate, being a function of the output of the current mirror and the value of the capacitor, even when a defect producing a high amplitude pulse is detected. Consequently, the threshold voltage, being a function of the envelope voltage, also will not rise faster than a predetermined rate and valid information pulses in the information signal can be detected even when they immediately follow a high amplitude defect.

The foregoing and other features and advantages of the invention will be apparent from the following more particular description of preferred embodiments of the invention, as illustrated in the accompanying drawings.

BRIEF DESCRIPTION OF THE DRAWINGS

FIG. 1 illustrates waveforms at various nodes in a prior art envelope follower;

FIG. 4 illustrates waveforms of signals at various nodes in the peak detector qualifier of the present invention.

DETAILED DESCRIPTION OF THE INVENTION

The solid waveform A in FIG. 1 illustrates an exemplary information signal from a read head associated with an optical or magnetic storage media. The first two and last three pulses shown will be referred to as "valid" pulses and have similar maximum amplitudes. The third pulse, however, is representative of a defect or glitch in the media or information signal and has a peak amplitude substantially higher than the others. Such a defect can originate from delamination or a defective pit in the surface of an optical disk, from a thermal spike generated in a magneto-resistive (MR) head, or from other physical media defects or circuit noise.

Figure 2:
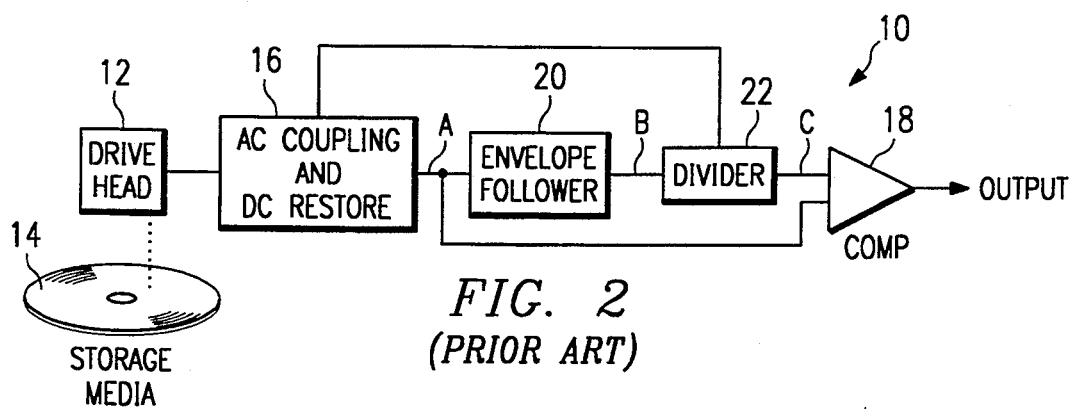
FIG. 2 illustrates a block diagram of a peak detector qualifier of the prior art.

FIG. 2 is a block diagram of a prior art peak detector qualifier 10. A drive head 12 reads information stored on a storage medium, such as an optical disk 14, and transmits readback signal through an AC coupler and DC restore circuit 16 (the output of which is referred to as an information signal A) to the peak detector qualifier 10. The information signal A is input to one input of a comparator 18. The information signal A is also processed by an envelope follower 20 which typically includes a capacitor and a diode and outputs an envelope voltage (the dashed waveform B in FIG. 1). The envelope voltage B is reduced to a threshold voltage (the dot-dashed waveform C in FIG. 1) by a voltage divider 22. Both the envelope voltage B and the threshold voltage C (the latter being a function of the envelope voltage B) decay at substantially the same relative rates until the capacitor in the envelope follower is charged again. The threshold voltage C is input to a second input of the comparator 18 which outputs a signal when the amplitude of the information signal A exceeds the threshold voltage C. In this manner, low amplitude noise is not qualified and processed as information.

As illustrated in FIG. 1, the threshold voltage C can rise to such a level (as when it follows the envelope voltage B during the defect of the third pulse in FIG. 1) and decay at such a rate that it can still be greater than the maximum amplitude of one or more valid information pulses which immediately follow the defect. Consequently, a valid pulse (such as the fourth pulse in FIG. 1) will not trigger the comparator 18 and will not, therefore, appear in the output of the comparator 18.

Figure 3:
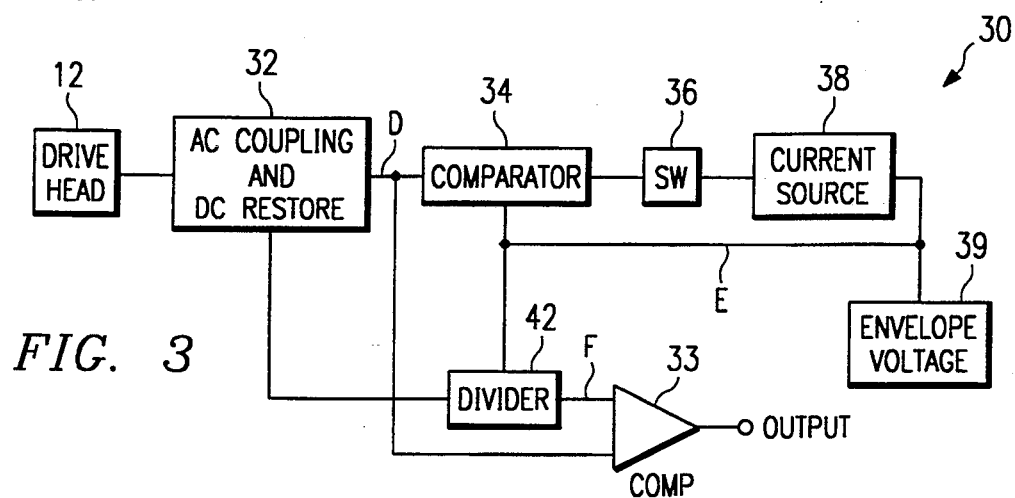
FIG. 3 illustrates a block diagram of one embodiment of the peak detector qualifier of the present invention.

FIG. 3 is a block diagram of a peak detector qualifier 30 of the present invention for processing an information signal the solid waveform D in FIG. 4 from the drive head 12. The peak detector qualifier 30 comprises an AC coupler 32 having an input for receiving the readback signal from the drive head 12 and an output, the information signal D, coupled to a first comparator 33. A second comparator 34 has an input which receives the information signal D and an output coupled to a switch 36. The switch 36 is coupled to a current source 38 having an output coupled to activate an envelope voltage source 39, such as a capacitor. The voltage across the source 39 is an envelope voltage (the dashed waveform E in FIG. 4) which is input to both the second comparator 34 and a voltage divider 42. The output of the voltage divider 42 is a threshold voltage (the dot-dashed waveform F in FIG. 4) which is input to the first comparator 33.

In operation, the maximum amplitudes of pulses in the information signal D, representing information read by the drive head 12, are compared with the envelope voltage E by the second comparator 34. When a pulse amplitude exceeds the envelope voltage E, the comparator 34 causes the switch 36 to activate the current source 38 which, in turn, charges the capacitor 40 (FIG. 5) of the envelope voltage source 39 at a predetermined rate. When the pulse has passed and the envelope voltage E exceeds the amplitude of the information signal D, the comparator 34 causes the switch to deactivate the current source 38 and the capacitor 40 is allowed to discharge through the voltage divider 42. Consequently, the threshold voltage F rises and falls in parallel with the envelope voltage E, representing the charging and discharging of the capacitor 40. Both the information signal D and the threshold voltage F are input to the first comparator 33 which outputs a signal when the amplitude of a pulse in the information signal D exceeds the threshold voltage F.

When a defect (such as the third pulse in FIG. 4) occurs on the information signal E, the comparator 34 and switch 36 will activate the current source 38 as previously described. If the width of the defect is similar to the width of valid pulses, the envelope and threshold voltages E and F will rise to approximately the same levels which they achieve when charging of the capacitor 40 is triggered by a valid pulse; both then fall as the capacitor 40 discharges when the current source 38 is deactivated. Consequently, the maximum amplitudes of valid pulses immediately following the defect will exceed the threshold voltage and be detected despite the defect. Even if the width of the defect is somewhat greater that the width of a valid pulse, the charge and discharge rates of the capacitor 40 are selected relative to the anticipated width and frequency of pulses such that, once a defect has passed, the amplitude of an immediately following valid pulse should be still greater than the level of the decaying threshold voltage. Therefore, defect propagation is significantly reduced by the envelope follower of the present invention.

Figure 5:
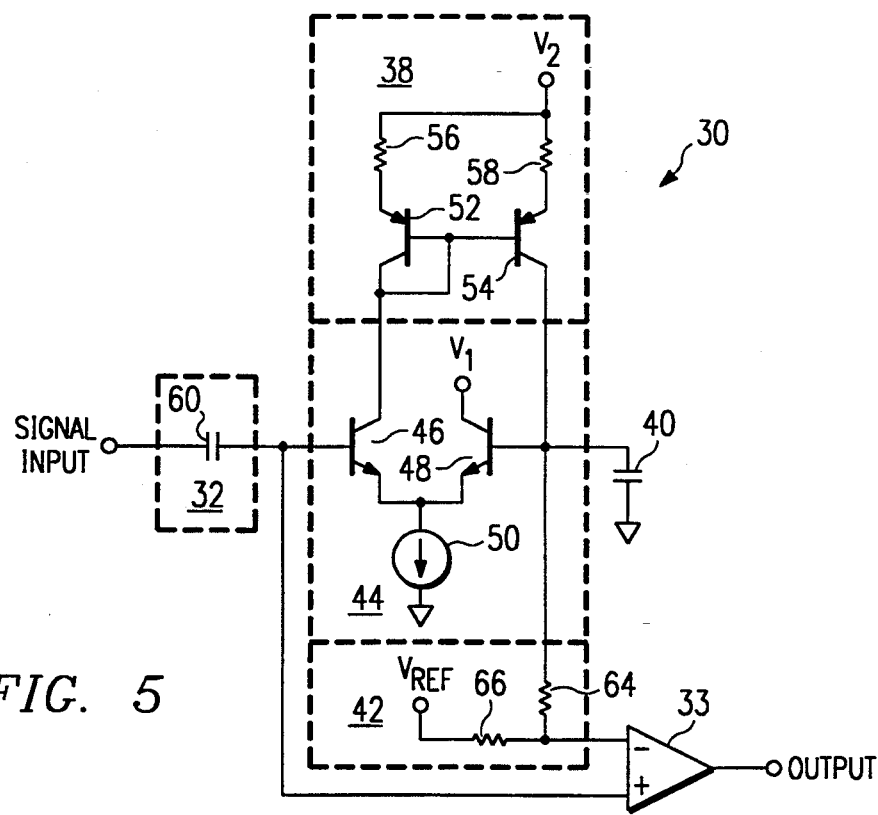
FIG. 5 is a schematic diagram of one embodiment of the peak detector qualifier of the present invention.

FIG. 5 is a schematic diagram of one embodiment of the peak detector 30 of FIG. 3 (for clarity, the DC restore circuit is not shown and the AC coupler 32 has been simplified). Preferably, the second comparator and switch 34 and 36 comprise a differential amplifier 44 having first and second NPN transistors 46 and 48, respectively, coupled at their emitters to a biasing current source 50. The collector of the second transistor 48 is coupled to a voltage source $V_1$ and the base is coupled to one terminal of the capacitor 40; the other terminal of the capacitor 40 is coupled to a ground reference. The base of the first transistor 46 is coupled through the AC coupler 32 to receive the information signal.

Also preferably, the current source 38 is a current mirror having third and fourth PNP transistors 52 and 54, respectively, which are coupled to each other at their bases and whose emitters are coupled through resistors 56 and 58 to voltage source $V_2$. The collector of the third transistor 52 is coupled to the collector of the first transistor 46 of the differential amplifier 44; the collector of the fourth transistor 54 is coupled to the base of the second transistor 48 and to the first terminal of the capacitor 40.

The AC coupler 32 is represented by a capacitor 60. The voltage divider 42 includes a first resistor 64, having one terminal coupled to the first terminal of the capacitor 40, and a second resistor 66 coupled between $V_{ref}$ and a second terminal of the first resistor 64. The comparator 33 has an inverting input, coupled to the second terminal of the resistor 64 of the voltage divider 42, and a non-inverting input, coupled to the second terminal of the capacitor 60 of the AC coupler 32.

In operation, the differential amplifier 44 has substantially linear response characteristics and senses the difference between the information signal D and the envelope voltage E across the capacitor 40. When the amplitude of the information signal D is below the envelope voltage E, the first transistor 46 is off and the second transistor 48 is on; the current from the bias current source 50 is sourced from $V_1$ coupled to the collector of the second transistor 48. When the amplitude of the information signal D is greater than the envelope voltage E, the first transistor 46 is on and the second transistor 48 is off; the bias current is conducted through the collector of the first transistor 46 to the current mirror 38. The current mirror 38 generates a current, being a function of the biasing current and the values of the two resistors 56 and 58, which charges the capacitor 40. Moreover, the level of the biasing current, the gain in the current mirror 38 and the value of the capacitor 40 determine the charge rate (in volts per second) of the capacitor 40. When the amplitude of the information signal D drops below the envelope voltage E again, the current mirror 38 is deactivated by the differential amplifier 44 and the capacitor 40 is allowed to discharge through the voltage divider 42. As previously detailed, the output of the voltage divider 42 is the threshold voltage F which is compared with the information signal D by the comparator 33.

While the invention has been particularly shown and described with reference to preferred embodiments thereof, it will be understood by those skilled in the art that various changes in form and details may be made therein without departing from the spirit and scope of the invention. For example, it will be understood that the resistors 56 and 58 of the current mirror 38 can be removed when the transistors 52 and 54 are well matched. It will also be understood that other configurations of the current mirror 38 and the differential amplifier 44 can be employed.

What is claimed is:

1. A peak detector qualifier, comprising:
   means for providing an envelope voltage;
   a differential amplifier coupled to receive the envelope voltage and an information signal, said differential amplifier having a first state when an amplitude of the information signal is greater than the envelope voltage;
   a current mirror, coupled to said differential amplifier and said providing means, for generating a predetermined current when said differential amplifier is in said first state, whereby said providing means is activated by the predetermined current; and
   a voltage divider for establishing a threshold voltage responsive to the envelope voltage.

2. The peak detector qualifier of claim 1, wherein said differential amplifier comprises:
   a first transistor having a base coupled to receive the information signal, an emitter coupled to receive a biasing current, and a collector; and
   a second transistor having a base coupled to a terminal of said providing means, an emitter coupled to receive said biasing current, and a collector coupled to a first voltage source;
   wherein said first transistor is in an off-state and said second transistor is in an on-state when the amplitude of the information signal is less than the envelope voltage and said first transistor is in an on-state and said second transistor is in an off-state when the amplitude of the information signal is greater than the envelope voltage.

3. The peak detector of claim 2, wherein said providing means comprises a capacitor.

4. The peak detector qualifier of claim 3, wherein said current source comprises:
   a third transistor having a collector coupled to said collector of said first transistor, an emitter coupled to a second voltage source, and a base; and
   a fourth transistor having a collector coupled to said first terminal of said capacitor, an emitter coupled to said second voltage source, and a base coupled to said base of said third transistor;
   wherein the predetermined current generated by said current mirror is a function of said biasing current and a value of said capacitor.

5. The peak detector qualifier of claim 1, wherein said voltage divider comprises:
   a first resistor having a first terminal coupled to said providing means; and
   a second resistor having a first terminal coupled to a second terminal of said first resistor and a second terminal coupled to receive a reference voltage.

6. The peak detector qualifier of claim 1, further comprising a comparator for comparing the amplitude of the information signal with the threshold voltage.

7. An envelope follower comprising:
   a capacitive device across which an envelope voltage develops;
   a differential amplifier, comprising:
     a first transistor having a base coupled to receive an information signal, an emitter coupled to a biasing current source, and a collector; and
     a second transistor having a base coupled to a first terminal of said capacitive device, an emitter coupled to said biasing current source, and a collector coupled to a first voltage source;
     wherein said first transistor is in an off-state and said second transistor is in an on-state when the amplitude of the information signal is less than the envelope voltage and said first transistor is in an on-state and said second transistor is in an off-state when the amplitude of the information signal is greater than the envelope voltage and;
   a current mirror for generating a predetermined current, comprising:
     a third transistor having a collector coupled to said collector of said first transistor, an emitter coupled to a second voltage source, and a base; and
     a fourth transistor having a collector coupled to said first terminal of said capacitive device, an emitter coupled to said second voltage source, and a base coupled to said base of said third transistor;
     wherein said current mirror is activated when the amplitude of the information signal is greater than the envelope voltage, whereby said capacitive device is charged by the predetermined current, and said current mirror is deactivated when the amplitude of the information signal is less than the envelope voltage, whereby said capacitive device is allowed to discharge.

8. The envelope follower of claim 7, wherein said capacitive device comprises a capacitor.

9. An apparatus for processing signals from a data storage device, comprising:

means for generating an information signal from data stored on a recording medium;

a current source for generating a predetermined current;

means for providing an envelope voltage;

sensing means for determining when the amplitude of the information signal is greater than the envelope voltage;

switching means, responsive to said sensing means, for activating said current source when the amplitude of the information signal is greater than the envelope voltage whereby said providing means is charged by the predetermined current and for deactivating said current source when the amplitude of the information signal is less than the envelope voltage whereby said providing means is allowed to discharge;

means responsive to said envelope voltage for establishing a threshold voltage; and comparing means, coupled to receive the information signal and the threshold voltage, for outputting a signal having a first state when the amplitude of the information signal is less than the threshold voltage and having a second state when the amplitude of the information signal is greater than the threshold voltage.

10. The apparatus of claim 9, wherein said sensing means and said switching means comprise a differential amplifier.

11. The apparatus of claim 10, wherein said differential amplifier comprises:

a first transistor having a base coupled to receive the information signal, an emitter coupled to a biasing current source, and a collector; and a second transistor having a base coupled to a first terminal of said providing means, an emitter coupled to said biasing current source, and a collector coupled to a first voltage source;

wherein said first transistor is in an off-state and said second transistor is in an on-state when the amplitude of the information signal is less than the envelope voltage and said first transistor is in an on-state and said second transistor is in an off-state when the amplitude of the information signal is greater than the envelope voltage.

12. The apparatus of claim 9, wherein said current source comprises:

a third transistor having a collector coupled to said switching means, an emitter coupled to a second voltage source, and a base; and a fourth transistor having a collector coupled to said first terminal of said providing means, an emitter coupled to said second voltage source, and a base coupled to said base of said third transistor;

wherein said current mirror is activated when the amplitude of the information signal is greater than the envelope voltage.

13. The apparatus of claim 9, wherein said current source comprises a current mirror.

14. The apparatus of claim 9, wherein said means for establishing a threshold voltage comprise a voltage divider.

15. The apparatus of claim 14, wherein said voltage divider comprises:

a first resistor having a first terminal coupled to said first terminal of said providing means; and a second resistor having a first terminal coupled to a second terminal of said first resistor and a second terminal coupled to receive a reference voltage.

16. The apparatus of claim 9, wherein said providing means is a capacitor.

17. The apparatus of claim 9, wherein said means for generating an information signal is an optical drive.

18. The apparatus of claim 9, wherein said means for generating an information signal is a magnetic tape drive.

19. The apparatus of claim 9, wherein said means for generating an information signal is a magnetic tape drive having a magneto-resistive head.

* * * * *